United States Patent [19]
Olmstead

[11] Patent Number: 4,490,653
[45] Date of Patent: Dec. 25, 1984

[54] DEFLECTION SYSTEMS AND RAMP GENERATORS THEREFOR

[75] Inventor: Harold W. Olmstead, Hillsboro, Oreg.

[73] Assignee: Tektronix, Inc., Beaverton, Oreg.

[21] Appl. No.: 366,014

[22] Filed: Apr. 6, 1982

[51] Int. Cl.$^3$ .................. H01J 29/70; H01J 29/76
[52] U.S. Cl. .................................................. 315/403
[58] Field of Search ............... 315/403, 387, 389, 384, 315/385, 409, 410

[56] References Cited

U.S. PATENT DOCUMENTS

| | | | |
|---|---|---|---|
| 3,842,310 | 10/1974 | Harf | 315/410 |
| 4,129,807 | 12/1978 | Infante | 315/399 |
| 4,164,687 | 8/1979 | Ahmed | 315/384 |
| 4,314,183 | 2/1982 | Heuze et al. | 315/403 |

Primary Examiner—Theodore M. Blum
Attorney, Agent, or Firm—John Smith-Hill

[57] ABSTRACT

A ramp generator comprises an integrating capacitor and a current source connected to the capacitor to charge the capacitor and thereby generate a ramp signal. A switching device is connected to the capacitor and is operative to discharge the capacitor periodically in response to a periodic control signal applied to a control terminal of the switching device. A comparator has a first input terminal connected to a peak detector, which detects the peak value of the ramp signal, and a second input terminal connected to receive a reference voltage. The comparator compares the peak value of the ramp signal and the reference voltage and is connected to the current source to control the rate of supply of current to the capacitor in response to the comparison result so as to maintain a predetermined relationship between the amplitude of the ramp signal and the reference voltage, independently of the frequency of the control signal.

18 Claims, 10 Drawing Figures

DEFLECTION SYSTEMS AND RAMP GENERATORS THEREFOR

This invention relates to deflection systems and ramp generators therefor.

There are several kinds of ramp generators such as a Miller integrator and a combination of a constant current source and a capacitor, and they are used in many kinds of electronic apparatus such as a raster generator in a CRT display apparatus. For example, in raster CRT display apparatus, ramp generators are synchronized with horizontal and vertical retrace blanking pulses (control signals) for displaying raster lines on the CRT screen. Different image formats (numbers of lines, vertical repetition rate and interlace mode) are usually used in different systems. If it is desired to display at equal sizes images of different formats, the ramp amplitudes must be the same and must thus be independent of the raster rates. In other words, the slopes of the ramp signals must be different in dependence upon the raster rates.

It is desirable that a single ramp generator be able to generate different slopes, because the raster display apparatus using this generator can then be adapted to different systems. In a conventional ramp generator circuit parameters are switched in order to generate different ramp signals in response to the control pulses, and accordingly such a conventional generator is bulky and complex in construction.

According to a first aspect of the present invention there is provided a ramp generator comprising an integrating capacitor, current source means connected to the capacitor to charge the capacitor and thereby generate a ramp signal, a switching device connected to said capacitor and having a control terminal and operative to discharge said capacitor periodically in response to a periodic control signal applied to said control terminal, a peak detector connected to the capacitor for detecting the peak value of the ramp signal, and a comparator having a first input terminal connected to the peak detector and a second input terminal for application of a reference voltage to the comparator, said comparator being operative to compare said peak value and said reference voltage and being connected to said current source means to control the rate of supply of current to the capacitor in response to the comparison result so as to maintain a predetermined relationship between the amplitude of the ramp signal and said reference voltage, independently of the frequency of the control signal.

The present invention may be used to provide a ramp generator which generates a constant amplitude ramp signal regardless of the frequency of the control signal. It is not necessary to change the effective circuit elements in order to maintain a constant amplitude ramp signal when the frequency of the control signal is changed, and accordingly the ramp generator is simple in construction.

According to a second aspect of the present invention there is provided a resonant deflection system for a raster scan CRT display apparatus including a CRT having a face, means for generating an electron beam which is incident on the face of the CRT, and deflection coil means for generating a magnetic field to deflect the point of incidence of the electron beam over the face of the CRT, said deflection system comprising a ramp generator which has a control terminal for receiving a periodic control signal and a reference voltage terminal for receiving a reference voltage and is operative to generate a ramp signal having an amplitude which bears a predetermined relationship to said reference voltage and having a frequency which bears a predetermined relationship to the frequency of the periodic control signal, and the deflection system further comprising correction circuitry connected to receive the ramp signal from the ramp generator and provide an output voltage conforming to a desired waveform, and a resonant deflection current generator connected to receive said output voltage and generate in response thereto a deflection current for energizing the deflection coil means, said deflection current generator also having an input for receiving a synchronization signal and having an output for providing a retrace blanking signal derived from the synchronization signal and which is applied to the control terminal of the ramp generator as said periodic control signal.

For a better understanding of the invention, and to show how the same may be carried into effect, reference will not be made, by way of example, to the accompanying drawings, in which.

Figure 1:
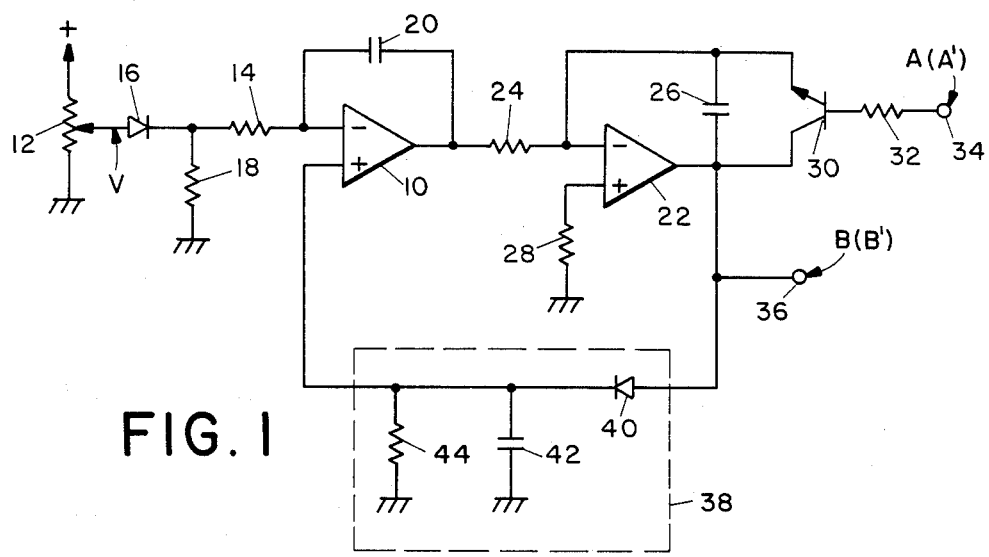
FIGS. 1, 3, 5 and 7 are circuit schematics of respective ramp generators.

FIG. 1 shows a circuit schematic of the first embodiment of the present invention which is used for a horizontal ramp generator of a raster display apparatus. The inverting input of comparator 10 such as an operational amplifier is connected to the center tap of potentiometer 12 through resistor 14 and diode 16. The end terminals of potentiometer 12 are connected to a positive voltage source and ground. The common junction of resistor 14 and diode 16 is grounded through resistor 18. Compensation capacitor 20 is inserted between the output and inverting input of comparator 10. The output of comparator 10 is connected to the inverting input of operational amplifier 22 through timing resistor 24, and timing capacitor 26 is connected between the output and inverting input of operational amplifier 22 with the non-inverting input grounded through resistor 28 to construct a Miller integrator. The emitter and collector of switching transistor 30 are connected to respective terminals of capacitor 26, and the base thereof is connected through resistor 32 to terminal 34 which receives a control signal A such as a horizontal retrace blanking pulse. The output of operational amplifier 22 is connected to output terminal 36 and connected through peak detector 38 to the non-inverting input of comparator 10. Peak detector 38 is a conventional type comprising diode 40, capacitor 42 and resistor 44.

Figure 2:
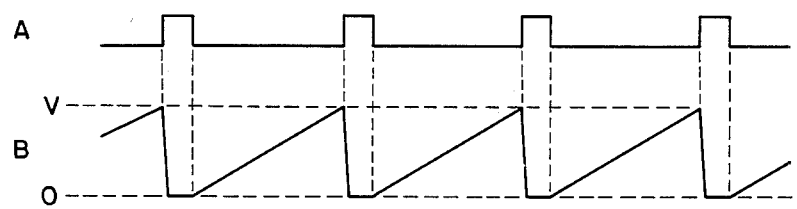
FIGS. 2, 4 and 8 are time charts for explaining the operation of the ramp generators of FIGS. 1, 3 and 7 respectively.
Figure 2:
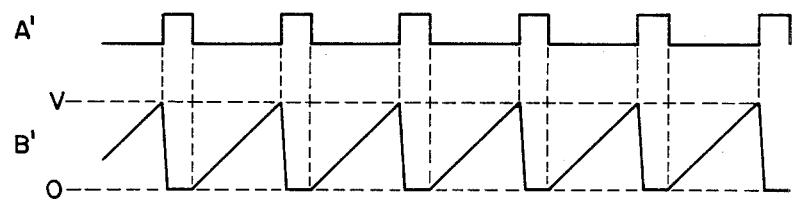

The operation of FIG. 1 will be described with reference to FIG. 2. When horizontal retrace blanking pulse A at terminal 34 is "High", transistor 30 turns on for discharging capacitor 26. Since the non-inverting input of operational amplifier 22 is grounded, output signal B at terminal 36 decreases to zero volts rapidly. The period while pulse A is "high" corresponds to the horizontal retrace time. When pulse A becomes "Low", transistor 30 turns off and the Miller integrator produces a linear ramp signal as shown in FIG. 2-B. The slope of ramp signal B is determined by the values of resistor 24 and capacitor 26 and the output voltage of comparator 10. When horizontal retrace blanking pulse A becomes "High" again, transistor 30 turns on to discharge capacitor 26. Peak detector 38 detects the peak voltage of ramp signal B, and comparator 10 compares the output from peak detector 38 with reference voltage V set by potentiometer 12. Diode 16 compensates the voltage across diode 40 in peak detector 38. If the peak voltage of ramp signal B is less than reference voltage V, the output voltage from comparator 10 becomes more negative to increase the current flowing through the Miller integrator. When the current for the Miller integrator increases, the signal B becomes a faster ramp and the peak thereof increases. If the peak voltage of ramp signal B is larger than reference voltage V, the output voltage from operational amplifier 10 becomes less negative to decrease the current for the Miller integrator, and the peak voltage decreases. Therefore, the positive peak of ramp signal B is maintained at reference voltage V. The negative peak is ground level.

As will be understood from the above description, the amplitude of ramp signal B is determined only by reference voltage V and is independent of the frequency of horizontal retrace blanking pulse A. Waveforms A' and B' show an example where the frequency of pulse A' is higher than that of pulse A. It should be noted that the amplitude of ramp signal B' is equal to that of ramp signal B. The amplitude of the ramp signal can be changed by adjusting potentiometer 12.

In the circuit shown in FIG. 1, the time constant circuit comprising capacitor 42 and resistor 44 is used in peak detector 38, so that it is not well suited for use with a low frequency control signal such as the vertical retrace blanking pulse of the raster apparatus. This problem is solved by the circuit shown in FIG. 3. This embodiment is similar to that of FIG. 1, so that the same reference numbers have been employed to designate like parts and only the differences will be discussed. Sample/hold circuit 46 is used as the peak detector between the output of the Miller integrator and comparator 10. Timing circuit 48, which comprises two monostable multivibrators, receives vertical retrace blanking pulse A from terminal 34, and applies strobe pulse B and control pulse C to sample/hold circuit 46 and switching transistor 30, respectively. Compensation resistor 45 and capacitor 47 are inserted between sample/hold circuit 46 and comparator 10.

Figure 3:
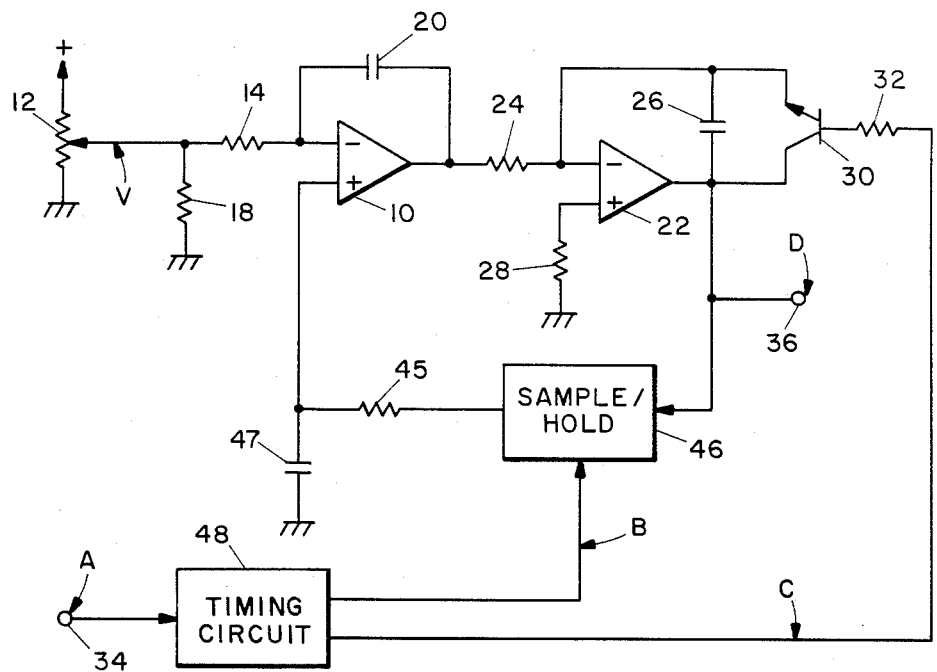
Figure 4:
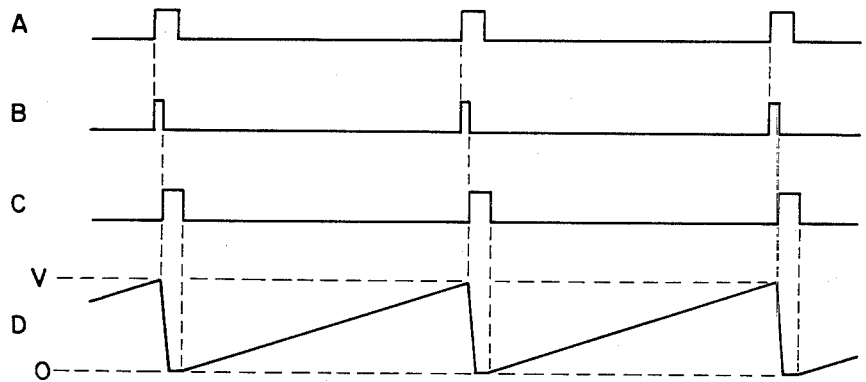

FIG. 4 is a time chart for explaining the operation of FIG. 3. The first monostable multivibrator of timing circuit 48 generates narrow pulse B in response to the leading edge of vertical retrace blanking pulse A. Pulse B is applied to sample/hold circuit 46 and to the second monostable multivibrator of timing circuit 48, which generates control pulse C in response to the trailing edge of pulse B. The pulse width of waveform C is equal to the desired vertical retrace time. Since pulse B occurs immediately before pulse C, sample/hold circuit 46 can detect the peak voltage of ramp signal D.

Figure 5:
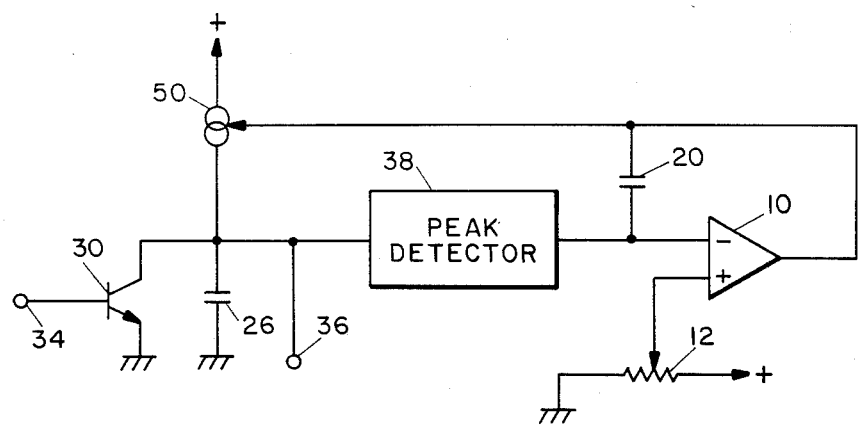

The FIG. 5 circuit comprises voltage controlled constant current source 50 and timing capacitor 26 series connected between a voltage source and ground. The collector and emitter of switching transistor 30 are connected to respective terminals of capacitor 26, and the base thereof receives the control pulse from terminal 34. The voltage across capacitor 26 is applied to output terminal 36 and peak detector 38. Comparator 10 with compensation capacitor 20 compares the output from peak detector 38 with the reference voltage from potentiometer 12, and controls the current value of current source 50 in accordance with the comparison result. The operation of the FIG. 5 circuit is similar to that of the FIGS. 1 and 3 circuits, and therefore will not be described further herein.

Figure 6:
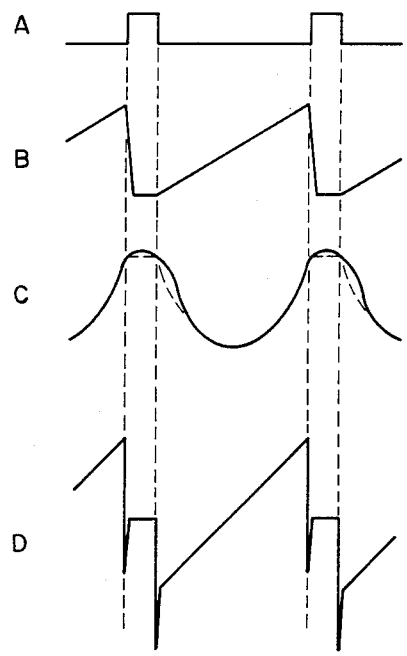
FIG. 6 is a time chart for explaining current distortion in a deflection coil.

Since the output from each of the circuits described above is a linear ramp signal having a constant amplitude regardless of the frequency of the control signal, the output ramp signal can be used as a standard signal for a horizontal or vertical scan deflection circuit to provide instantaneous beam position information in the raster display apparatus. In FIG. 6, waveforms A and B are respectively the control signal (horizontal retrace blanking pulse) and the ramp signal described hereinbefore. Waveform C represents a typical deflection correction current signal that would flow through a deflection coil (this signal is easily generated by a multiplier circuit which uses waveform B as an input), wherein the dotted line indicates the applied waveform and the continuous line indicates the actual current waveform. Waveform D represents the voltage across the deflection coil. Since the deflection coil is an inductor, the current cannot change rapidly unless an extremely large voltage spike occurs. Due to practical voltage supply limits this is not possible. Therefore, the deflection current actually flowing in the coil will be distorted from the ideal waveform whenever the current needs to change rapidly. As seen in waveform C this occurs at the trailing edge of pulse A. Moreover, the lowest level of ramp signal B is zero volt, but it is desirable for zero volt to represent the center of the CRT screen.

Figure 7:
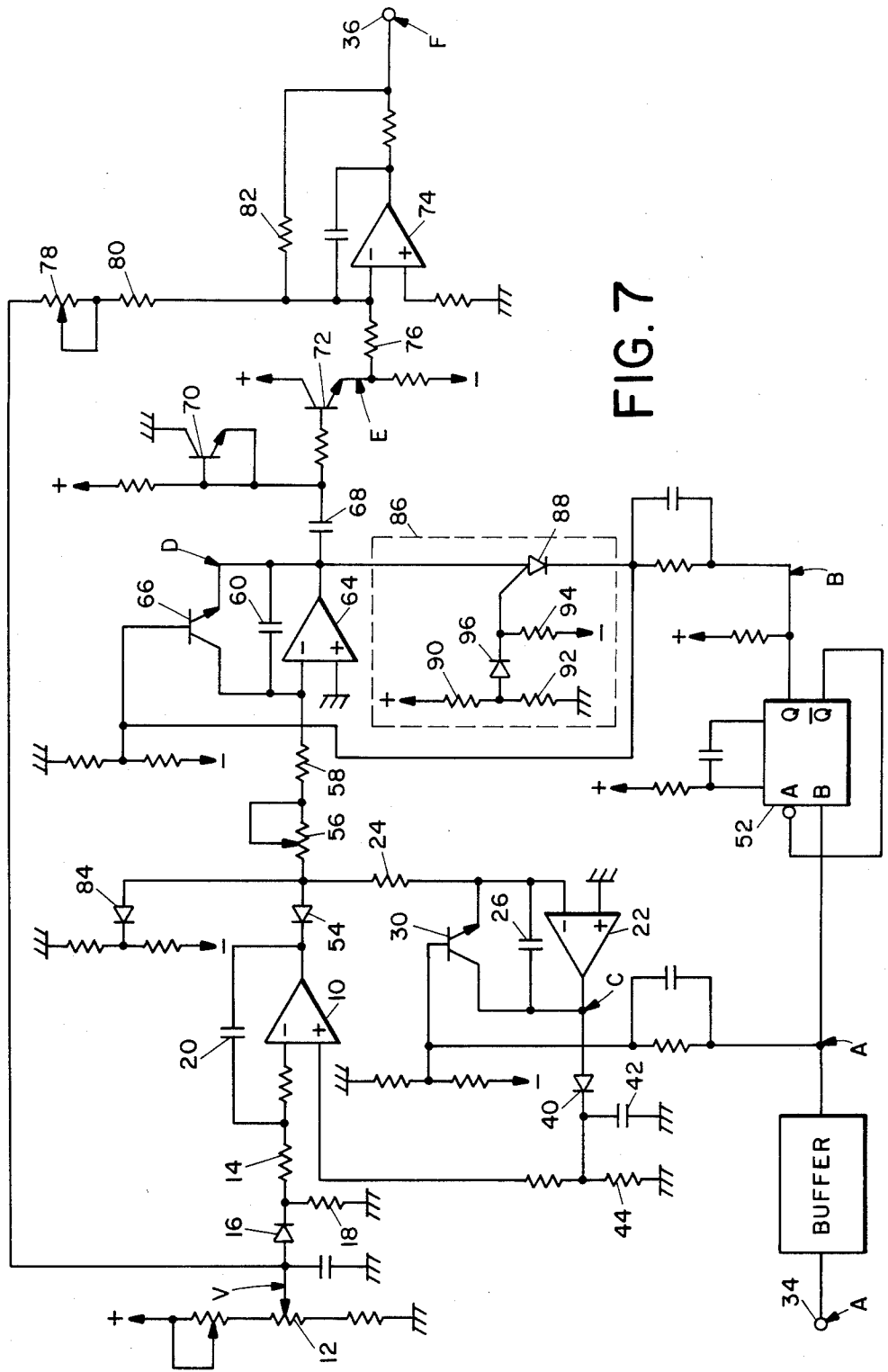

The above problems are solved by means of the circuit shown in FIG. 7 which is a development of the circuit shown in FIG. 1. In the FIG. 7 circuit the output ramp signal starts before the trailing edge of the control signal such as the horizontal retrace blanking pulse, and therefore the current in the deflection coil has time to approach the ideal waveform at the trailing edge of the horizontal retrace blanking pulse. Moreover, the DC level of the ramp signal is shifted.

Figure 8:
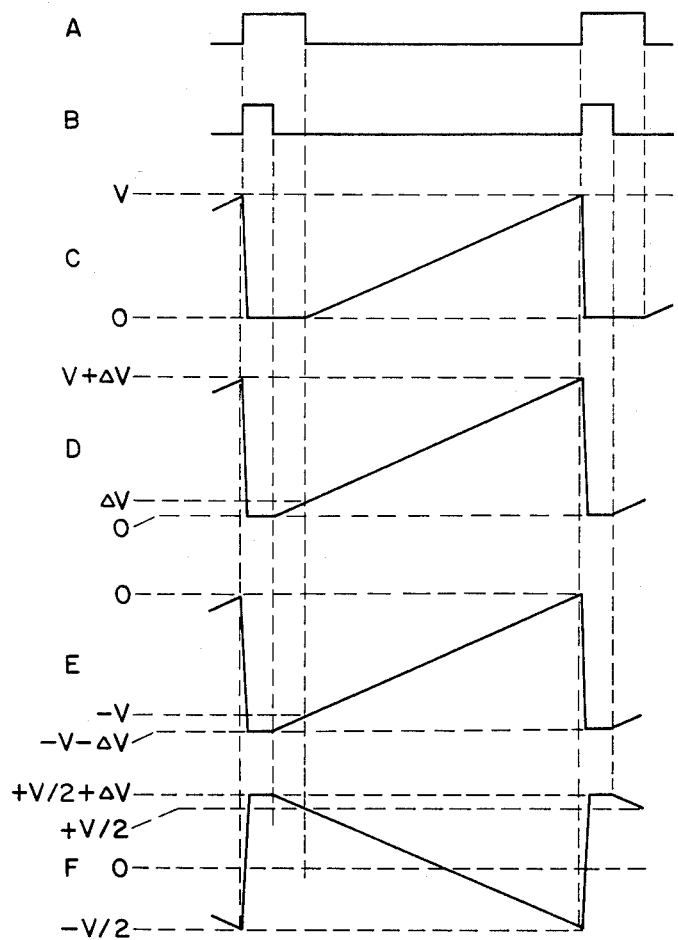

In FIG. 7, reference numerals 10 through 26, 30, 40, 42 and 44 represent the same components as in FIG. 1. Buffered horizontal retrace blanking pulse A from terminal 34 is applied to monostable multivibrator 52 and to the base of switching transistor 30. As described hereinbefore, the Miller integrator comprising operational amplifier 22, resistor 24 and capacitor 26 generates ramp signal C, the amplitude of which is determined by reference voltage V at potentiometer 12. The output DC voltage from comparator 10 is applied through diode 54 to another Miller integrator comprising timing resistors 56, 58, timing capacitor 60 and operational amplifier 64. This second Miller integrator is controlled by switching transistor 66 which receives second control pulse B from multivibrator 52. For example, the pulse widths of pulses A and B are respectively 6 $\mu$s and 3 $\mu$s, and since the pulse B is generated in response to the leading edge of the pulse A the trailing edge of pulse B is prior to that of pulse A by 3 $\mu$s. The time constant of the second Miller integrator is adjusted by variable resistor 56 so that it is equal to the time constant of the first Miller integrator comprising components 22, 24 and 26. Therefore, the second Miller integrator starts to generate ramp signal D prior to ramp signal C generated by the first Miller integrator but both ramp signals have the same slope. Consequently the peak-to-peak amplitude of ramp signal D is greater than that of ramp signal C, being denoted V+ΔV in FIG. 8. It should be noted that ramp signal C is only used for controlling the slope of ramp signal D.

Ramp signal D is applied to a clamp circuit comprising capacitor 68, diode connected transistor 70 and emitter follower transistor 72 (transistors 70 and 72 are in the same package for temperature compensation). The positive peak (V+ΔV) of ramp signal D is thereby clamped to ground level. The inverting input of operational amplifier 74 receives clamped ramp signal E through resistor 76 and reference voltage V through resistors 78, 80. Feedback resistor 82 is connected between output terminal 36 and the inverting input of operational amplifier 74. The values of resistors 76 through 82 are selected so that the gain for ramp signal E is one and the gain of reference voltage V is one half. Thus, the DC level of ramp signal E is shifted and waveform F can be obtained at output terminal 36. Since the voltages of ramp signal F are +V/2 and −V/2 at the trailing and leading edges of horizontal retrace blanking pulse A, the ramp signal F starts prior to the trailing edge of horizontal pulse A, the ramp generator of FIG. 7 solves the above described problems.

In normal operation, ramp signal F is generated in response to horizontal retrace blanking pulse A, and diodes 54 and 84 are on and off respectively. If horizontal retrace blanking pulse A stops, the output voltage from the comparator 10 will remain at the positive power supply voltage applied to comparator 10. Since a negative voltage is necessary for the second Miller integrator, diodes 54 and 84 are off and on respectively and the second Miller integrator receives a negative voltage through diode 84. Moreover, switching transistor 65 for the second Miller integrator receives control pulses from free running circuit 86 comprising programmable uni-junction transistor (PUT) 88 and a bias circuit consisting of resistors 90, 92, 94 and diode 96. Diode 96 compensates the anode-gate voltage of PUT 88. When the voltage of ramp signal D reaches the anode voltage of diode 96, PUT 88 turns on and supplies current to the base of transistor 66. When the discharge current from capacitor 60 stops, PUT 88 turns off. It should be noted that the anode voltage of diode 96 is higher than reference voltage V set by potentiometer 12. This free-running operation ensures that the second Miller integrator continues to generate the ramp signal when horizontal retrace blanking pulse A stops.

Figure 9:
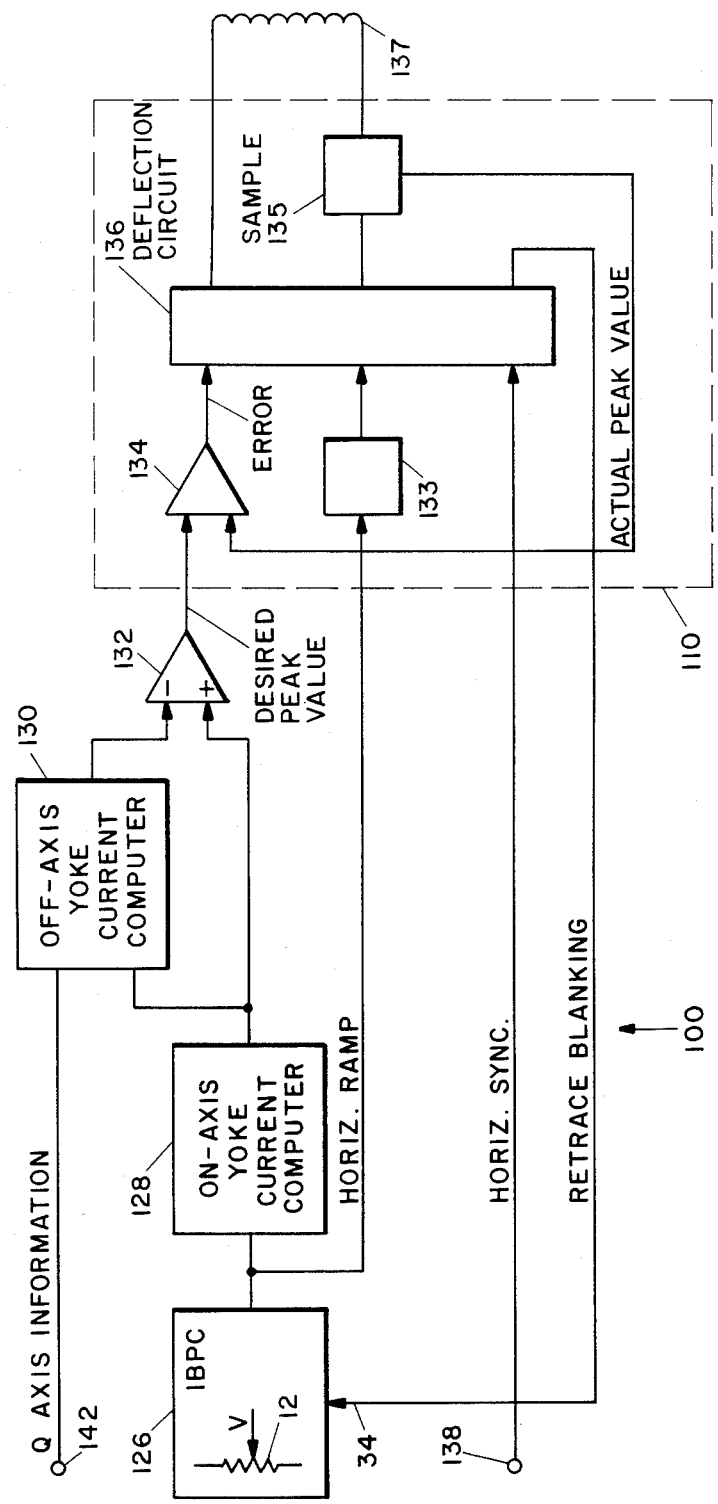
FIG. 9 is a block diagram of a horizontal resonant scan deflection system including as one block the ramp generator of FIG. 7.
Figure 10:
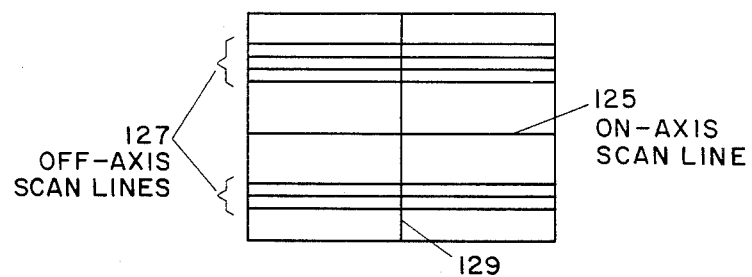
FIG. 10 is a graphical representation of the face of a CRT.

The ramp generators shown in FIGS. 1, 3, 5 and 7 may be used to provide instantaneous beam position information for controlling beam deflection in a raster CRT display apparatus. FIG. 9 illustrates by way of example a resonant deflection system 100 including such a ramp generator, preferably that of FIG. 7, and a resonant deflection current generator 110. The deflection system 100 is used to drive the horizontal deflection yoke 137 of the CRT display apparatus so that the beam executes a series of horizontal scan lines over the face of the CRT, as shown in FIG. 10, when the vertical deflection yoke is properly driven. FIG. 10 shows the face of CRT with several scan lines including on-axis scan line 125 and off-axis scan lines 127. A quadrature axis 129 is also shown in FIG. 10 for reference in the following description.

The deflection system receives a synchronization (timing) signal applied to the input terminal 138. A quadrature axis instantaneous beam position signal is applied to input terminal 142 in order to correct the horizontal geometry as quadrature axis beam position varies. The deflection system includes an instantaneous beam position computer (IBPC) 126 which is formed by the ramp generator of FIG. 7, and the voltage V derived from the potentiometer 12 constitutes a scan size signal. As these input signals vary, the output of resonant scan deflection circuit 136 will remain calibrated to produce a linear scan on the face of the CRT as shown graphically in FIG. 10. The horizontal retrace blanking signal is fed back to instantaneous beam position computer 126 from resonant scan deflection circuit 136. The output from IBPC 126 is then fed to deflection circuit 136 and also to on-axis deflection coil current computer circuit 128. The output from circuit 128 is supplied to subtraction circuit 132 and off-axis deflection coil current correction computer circuit 130 which also receives the quadrature axis instantaneous beam position information via input terminal 142. The output from off-axis current correction computer circuit 130 is supplied to subtraction circuit 132 whose output is supplied to the resonant deflection current generator formed by controlled scan power supply amplifier 134 and deflection circuit 136. A current sampler 135 is used to sample the current in the deflection yoke 137 and provide the output thereof to the power supply amplifier 134.

The operation of the deflection system will be described hereinafter. It is assumed that deflection circuit 136 is calibrated to yield equal distance increments on the face of the CRT for equal increments of time in the video signal. IBPC 126 predicts where the beam should be at any point in time. No matter what the sync period is, one single complete trace on the CRT should correspond to one period of the sync pulse, so as time-to-position conversion can be made simply based on what percent of the total sync period has elapsed without regard to the absolute measure of what the period is. As explained hereinbefore, IBPC 126 consists of a ramp signal generator for generating a ramp signal of V+ΔV volts peak-to-peak. Typically, V is 7 volts and the on screen portion of the ramp excursion is from −3.5 volts to +3.5 volts; with zero volts representing the center of the CRT, −3.5 volts representing the left edge and +3.5 volts representing the right edge. The scan size control signal V acts on the peak-to-peak amplitude of this ramp signal such that if a half size scan is desired, the peak-to-peak amplitude of the on screen portion of the ramp signal will be halved to 3.5 volts.

The instantaneous beam position information thus obtained is fed to scan deflection circuit 136 and also is on-axis deflection coil current computer circuit 128. The ramp signal is used to perform an open loop horizontal (on-axis) linearity correction in circuit 133. This correction is needed to cancel out the ramp of voltage lost in resonant scan circuit 136 due to IR losses (voltage drop) in the deflection yoke 137 and deflection transistor (not shown). Another form of on-axis linearity correction needed in order to accomplish linear beam deflection is the well known "S" correction which is accomplished by using an appropriate "S" capacitor. This function is accomplished by an automatic "S" correction capacitance selector which is a part of resonant scan deflection circuit 136. The "S" correction circuit is described and claimed in co-pending application Ser. No. 366,011 filed Apr. 6, 1982, the disclosure of which is hereby incorporated by reference herein.

The on-axis deflection coil current computer 128 receives the instantaneous beam position information from IBPC 126 and generates internally a voltage waveform which conforms to the shape of the deflection coil current waveform required in order for the beam to sweep linearly across the face of the CRT. Computer 128 detects the negative peak of this voltage waveform and provides at its output a D.C. voltage representative of the potential of the negative peak. (Since the voltage waveform is symmetrical, this D.C. voltage is also representative of the peak-to-peak voltage of the waveform and of the desired horizontal scan current).

Off-axis deflection coil current correction computer 130 generates a signal which compensates for side pincushion distortion of the raster, which occurs because, for the same peak-to-peak horizontal deflection current, horizontal scan lines which are farther from the center of the CRT are longer than those which are closer to the center of the CRT. The severity of the distortion in turn depends on the horizontal scan size. Accordingly, computer 130, which receives from computer 128 a first input signal representative of the desired horizontal scan current and from terminal 142 a second input signal representative of the instantaneous position of the beam on the vertical or quadrature axis, contains a nonlinear circuit function which enables it to produce a voltage signal that can be subtracted by subtractor 132 from the on-axis deflection coil current signal provided by computer 128 before it is applied to controlled scan power supply amplifier 134 in order to eliminate the off-axis pincushion distortion. This computed deflection coil current information is used to properly control the peak-to-peak current in the deflection yoke as the scan size input is varied and as the sync period is changed. Controlled scan power supply amplifier 134 and resonant scan deflection circuit 136 make a closed loop system that compares the actual peak deflection coil current via deflection coil current sampler 135 to the desired value of the peak deflection coil current provided by subtractor 132. From the comparison, amplifier 134 generates an error signal which changes the power supply voltage for resonant scan deflection circuit 136 in such a direction to make the error between the sample and the control signal become zero.

In summary, the peak-to-peak current in the deflection coil will remain constant as the horizontal sync rate is changed and the peak-to-peak deflection coil current will vary to maintain proper deflection size based on the quadrature axis instantaneous beam position information for horizontal lines displaced up and down along the quadrature axis of the raster.

Detailed description of all circuit blocks 128, 130, 132, 134 and 136 shown in FIG. 9 is unnecessary because a person skilled in the art will be able to implement them easily based on the foregoing description. For example, deflection circuit 136 may be of conventional design including a current sensing transformer or resistor. Controlled scan power supply amplifier 134 may be a transistor whose principal current path is connected between a high voltage source (100 volts or higher depending on the application) and the deflection yoke and whose base voltage is controlled by the output from subtraction circuit 132, which may be a differential operational amplifier. The horizontal retrace blanking signal may be derived from the deflection yoke, which develops a high voltage during the retrace period of the deflection signal.

The horizontal deflection system shown in FIG. 9 may be used in the deflection system described and claimed in co-pending application Ser. No. 366,012 filed Apr. 6, 1982 the disclosure of which is hereby incorporated by reference herein, in which case the instantaneous beam position information for the convergence correction current generator and the vertical deflection circuit would be taken from the output of IBPC 126. The vertical deflection circuit for the deflection system may also include a ramp generator, preferably as shown in FIG. 3, providing a rate invariant output signal.

Instantaneous beam position information allows the deflection system to operate at continuously variable scan rates or a plurality of discrete scan rates as well as controllable vertical and horizontal scan size. Also, interrelating the vertical and horizontal circuits is especially useful to provide always correct deflection signals. In the case of a color CRT display apparatus, the convergence control signal is also provided easily.

The invention is not restricted to the various circuits which have been described and illustrated, since modifications may be made by a person skilled in the art without departing from the scope of the invention as defined in the appended claims.

I claim:

1. A ramp generator comprising an integrating capacitor, current source means, connected to the capacitor to charge the capacitor and thereby generate a ramp signal, a switching device connected to said capacitor and having a control terminal and operative to discharge said capacitor periodically in response to a periodic control signal applied to said control terminal, a peak detector connected to the capacitor for detecting the peak value of the ramp signal, a comparator having a first input terminal connected to the peak detector and a second input terminal for application of a reference voltage to the comparator, said comparator being operative to compare said peak value and said reference voltage and being connected to said current source means to control the rate of supply of current to the capacitor in response to the comparison result so as to maintain a predetermined relationship between the amplitude of the ramp signal and said reference voltage, independently of the frequency of the control signal.

2. A ramp generator in accordance with claim 1, wherein said current source means comprises an amplifier connected to the capacitor in Miller integrator configuration.

3. A ramp generator in accordance with claim 1, wherein said current source means comprises a voltage-controlled constant current source.

4. A ramp generator in accordance with claim 1 or 2, wherein the peak detector comprises a sample/hold circuit and said control terminal is operatively connected to the switching device through a timing circuit which is connected to actuate said sample/hold circuit, said timing circuit responding to application of the control signal by first actuating the sample/hold circuit and then operating said switching device.

5. A ramp generator in accordance with claim 1, wherein said current source means comprises a first amplifier connected to the capacitor so as to form therewith a first Miller integrator, and the comparator has an output terminal connected to a second Miller integrator, which has an output terminal and includes a second integrating capacitor, and the ramp generator further comprises a second switching device which is connected to said second integrating capacitor and has a control terminal and is operative to discharge said second integrating capacitor periodically in response to a second control signal of equal frequency to the first-mentioned control signal, whereby a second ramp signal is provided at the output terminal of the second Miller integrator, the frequency of the second ramp signal being equal to the frequency of the first-mentioned ramp signal.

6. A ramp generator in accordance with claim 5, wherein the control terminal of the second switching device is connected to the control terminal of the first-mentioned switching device through timing means, whereby the two ramp signals are of different duration.

7. A ramp generator in accordance with claim 6, including means for controlling the rate of charge of the second integrating capacitor, whereby the slope of the second ramp signal is made equal to that of the first-mentioned ramp signal and the peak-to-peak magnitude of the second ramp signal differs from the peak-to-peak magnitude of the first ramp signal by an amount which is dependent on the difference in duration between the ramp signals.

8. A signal generator in accordance with claim 5, wherein the output terminal of the second Miller integrator is connected to a clamp circuit for shifting the DC level of the second ramp signal.

9. A ramp generator in accordance with claim 5, comprising a operational amplifier having an input terminal connected to receive the second ramp signal and also connected to said second input terminal of the comparator, whereby a predetermined portion of the reference voltage is subtracted from the second ramp signal.

10. A ramp generator in accordance with claim 5, comprising a free-running circuit connected to the control terminal of said second switching device and operative to discharge periodically the capacitor of the second Miller integrator in the event of failure of the second control signal.

11. A resonant deflection system for a raster scan CRT display apparatus including a CRT having a face, means for generating an electron beam which is incident on the face of the CRT, and deflection coil means for generating a magnetic field to deflect the point of incidence of the electron beam over the face of the CRT, said deflection system comprising a ramp generator which has a control terminal for receiving a periodic control signal and a reference voltage terminal for receiving a reference voltage and is operative to generate a ramp signal having an amplitude which bears a predetermined relationship to said reference voltage and is substantially independent of the frequency of the periodic control signal, said ramp signal having a frequency which bears a predetermined relationship to the frequency of the periodic control signal, and the deflection system further comprising correction circuitry connected to receive the ramp signal from the ramp generator and provide an output voltage conforming to a desired waveform, and a resonant deflection current generator connected to receive said output voltage and generate in response thereto a deflection current for energizing the deflection coil means, said deflection current generator also having an input for receiving a synchronization signal and having an output for providing a retrace blanking signal derived from the synchronization signal and which is applied to the control terminal of the ramp generator as said periodic control signal.

12. A resonant deflection system in accordance with claim 11, wherein said correction circuitry comprises a first correction circuit for generating a first correction signal dependent upon the size of the scanned area of the face of the CRT measured in the scanning direction, a second correction circuit for generating a second correction signal dependent on the instantaneous position of the point of incidence of the electron beam on the face of the CRT in a direction perpendicular to the scanning direction, and means for combining the first and second correction signals to provide an output signal representative of the desired peak value of the deflection current.

13. A resonant deflection system in accordance with claim 12 wherein said resonant deflection current generator includes sampling means for providing an output signal representative of the actual peak value of the deflection current, and supply amplifier means for comparing the output signal of the sampling means with the output signal of the correction circuitry and providing an error signal in response thereto, and means for responding to said error signal to adjust the actual peak value of the deflection current to conform to the derived peak value of the deflection current.

14. A resonant deflection system in accordance with claim 12, wherein the second correction circuit is connected to the first correction circuit, so that the second correction signal depends not only upon the instantaneous position of the beam in the direction perpendicular to the scanning direction but also upon the first correction signal.

15. A resonant deflection system in accordance with claim 11, wherein the resonant deflection current generator includes means connected to receive the ramp signal from the ramp generator for adjusting the deflection current to compensate for non-linearity in the relationship between increments in deflection current and increments in displacement of the point of incidence of the electron beam on the face of the CRT in the scanning direction.

16. A resonant deflection system in accordance with claim 11, wherein said ramp generator comprises an integrating capacitor, current source means connected to the capacitor to charge the capacitor and thereby generate a ramp signal, a switching device connected to said capacitor and having a control terminal, constituting the control terminal of the ramp generator, and operative to discharge said capacitor periodically in response to a periodic control signal applied to said control terminal, a peak detector connected to the capacitor for detecting the peak value of the ramp signal, a comparator having a first input terminal connected to the peak detector and a second input terminal for application of a reference voltage to the comparator, said comparator being operative to compare said peak value and said reference voltage and being connected to said current source means to control the rate of supply of current to the capacitor in response to the comparison result so as to maintain a predetermined relationship between the amplitude of the ramp signal and said reference voltage, independently of the frequency of the control signal.

17. A resonant deflection system according to claim 11, wherein the ramp generator comprises an integrating capacitor, current source means connected to the capacitor to charge the capacitor and thereby generate a ramp signal, a switching device connected to said capacitor and having a control terminal, constituting the control terminal of the ramp generator, and operative to discharge said capacitor periodically in response to a periodic control signal applied to said control terminal, and feedback means connected between the capacitor and the current source means for controlling the rate of supply of current to the capacitor by the current source means in order to maintain a predetermined relationship between the amplitude of the ramp signal and said reference voltage, independently of the frequency of the control signal.

18. A ramp generator comprising an integrating capacitor, current source means connected to the capacitor to charge the capacitor and thereby generate a ramp signal, a switching device connected to said capacitor and having a control terminal and operative to discharge said capacitor periodically in response to a periodic control signal applied to said control terminal, and feedback means connected between the capacitor and the current source means for controlling the rate of supply of current to the capacitor by the current source means in order to maintain a predetermined relationship between the amplitude of the ramp signal and said reference voltage, independently of the frequency of the control signal.

* * * * *

UNITED STATES PATENT AND TRADEMARK OFFICE
CERTIFICATE OF CORRECTION

PATENT NO. : 4,490,653

DATED : December 25, 1984

INVENTOR(S) : Harold W. Olmstead

It is certified that error appears in the above—identified patent and that said Letters Patent is hereby corrected as shown below:

Column 2, line 22, reads "not" should be --now--.

Column 2, line 68, reads "high" should be --"High"--.

Column 6, line 37, reads "as" should be --a--.

Signed and Sealed this

Sixteenth Day of April 1985

[SEAL]

Attest:

DONALD J. QUIGG

Attesting Officer     Acting Commissioner of Patents and Trademarks